(12) United States Patent
Caldwell et al.

(10) Patent No.: US 7,198,276 B2
(45) Date of Patent: Apr. 3, 2007

(54) ADAPTIVE ELECTROSTATIC PIN CHUCK

(75) Inventors: Brian Neal Caldwell, Milton, VT (US); Raymond Walter Jeffer, South Burlington, VT (US); Louis M. Kindt, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 10/605,773

(22) Filed: Oct. 24, 2003

(65) Prior Publication Data

US 2005/0087939 A1    Apr. 28, 2005

(51) Int. Cl.
B23B 31/28    (2006.01)

(52) U.S. Cl. .................. 279/128; 361/234; 118/500; 118/730; 451/398; 29/407.05

(58) Field of Classification Search ................ 279/128; 361/233, 234; 118/500, 728, 729, 730; 451/5, 451/24, 288, 398; 29/25.35, DIG. 900, 243, 29/407.05, 407.09, 407.1, 559, 714
See application file for complete search history.

(56) References Cited

U.S. PATENT DOCUMENTS

| | | | | |
|---|---|---|---|---|
| 4,357,006 A | * | 11/1982 | Hayes ........................... | 269/21 |
| 4,551,192 A | * | 11/1985 | Di Milia et al. ........ | 156/345.51 |
| 4,684,113 A | * | 8/1987 | Douglas et al. ................ | 269/21 |
| 5,643,044 A | * | 7/1997 | Lund .............................. | 451/5 |
| 5,677,824 A | * | 10/1997 | Harashima et al. .......... | 361/234 |
| 5,708,556 A | * | 1/1998 | van Os et al. ............... | 361/234 |
| 5,790,365 A | * | 8/1998 | Shel ............................ | 361/234 |
| 5,796,066 A | * | 8/1998 | Guyot .................... | 219/121.48 |
| 5,810,933 A | * | 9/1998 | Mountsier et al. .......... | 118/724 |
| 5,825,607 A | * | 10/1998 | Burkhart ..................... | 361/234 |
| 5,841,624 A | * | 11/1998 | Xu et al. ..................... | 361/234 |
| 5,848,670 A | * | 12/1998 | Salzman ...................... | 187/272 |
| 5,872,694 A | * | 2/1999 | Hoinkis et al. ............. | 361/234 |
| 5,885,423 A | * | 3/1999 | Guyot .................... | 204/298.15 |
| 5,956,837 A | * | 9/1999 | Shiota et al. ................. | 29/559 |
| 6,075,375 A | * | 6/2000 | Burkhart et al. ............ | 324/758 |
| 6,081,414 A | * | 6/2000 | Flanigan et al. ............ | 361/234 |
| 6,177,023 B1 | * | 1/2001 | Shang et al. .................. | 216/67 |
| 6,305,677 B1 | * | 10/2001 | Lenz ............................ | 269/13 |

(Continued)

FOREIGN PATENT DOCUMENTS

JP     62166537 A   *  7/1987
JP     06177141 A   *  6/1994

Primary Examiner—Monica Carter
Assistant Examiner—Michael W. Talbot
(74) Attorney, Agent, or Firm—Gibb I.P. Law Firm, LLC; Richard M. Kotulak, Esq.

(57) ABSTRACT

Disclosed is an electrostatic chuck and system for maintaining a device flat within the electrostatic chuck. The electrostatic chuck has a plate, height adjustment mechanisms connected to the plate; and electrostatic chuck pins connected to the height adjustment mechanisms. The system provides a measurement tool adapted to measure the flatness of the device held by the electrostatic chuck pins and a computer connected to the height adjustment mechanisms and the measurement tool. The computer adjusts the flatness of the device by adjusting the height adjustment mechanisms based on feedback from the measurement tool. The computer is adapted to change the shape of the device to conform to a pre-existing standard.

28 Claims, 3 Drawing Sheets

U.S. PATENT DOCUMENTS

| | | | |
|---|---|---|---|
| 6,377,060 B1 * | 4/2002 | Burkhart et al. | 324/754 |
| 6,389,677 B1 * | 5/2002 | Lenz | 29/559 |
| 6,570,752 B2 * | 5/2003 | Morita et al. | 361/234 |
| 6,628,503 B2 * | 9/2003 | Sogard | 361/324 |
| 6,805,338 B1 * | 10/2004 | Okuda | 269/21 |
| 6,806,007 B1 * | 10/2004 | Abdo et al. | 430/5 |
| 2002/0126437 A1 * | 9/2002 | Chen | 361/234 |
| 2002/0134511 A1 * | 9/2002 | Ushioda et al. | 156/345.51 |
| 2002/0141133 A1 * | 10/2002 | Anderson et al. | 361/234 |
| 2004/0045509 A1 * | 3/2004 | Or et al. | 118/729 |
| 2005/0207089 A1 * | 9/2005 | Ito | 361/234 |

* cited by examiner

ADAPTIVE ELECTROSTATIC PIN CHUCK

BACKGROUND OF INVENTION

1. Field of the Invention

The present invention generally relates to electrostatic chucks and more particularly to an improved electrostatic chuck that includes height adjustment mechanisms to compensate for foreign matter particles and to improve flatness of the item being clamped.

2. Description of the Related Art

There are many situations when it is important to hold a device, such as a layer of material, a laminated structure, reflective mask, optical mask, etc. in an extremely flat manner. For example, Extreme Ultraviolet Lithography (EUVL) is a promising technology for the next generation lithography. Image placement specifications for this technology are very tight and in order to meet these specifications, masks must be as close to perfectly flat as possible in the stepper as well as in the write and inspection tools used in the manufacturing of these masks. Electrostatic chucks (ESC) can be used to pull the EUVL mask flat at the necessary processing steps that require a perfectly flat mask, such as the stepper, write tool, or inspection tool.

SUMMARY OF INVENTION

The invention provides an electrostatic chuck and method/system for maintaining a device flat within the electrostatic chuck. The electrostatic chuck has a base plate, height adjustment mechanisms connected to the plate, and electrostatic chuck pins connected to the height adjustment mechanisms. The system provides a measurement tool adapted to measure the flatness of the device (e.g., mask) held by the electrostatic chuck pins and a computer linked to the height adjustment mechanisms and the measurement tool. The computer adjusts the flatness of the device by adjusting the height adjustment mechanisms based on feedback from the measurement tool, such as an interferometer. The ESC pins are adapted to change the shape of the device to conform to a preexisting standard based on output from the interferometer.

The height adjustment mechanisms individually control the height of each electrostatic chuck pin and control the flatness of the device being held by the electrostatic chuck pins. For example, the height adjustment mechanisms can compensate for foreign matter particles between the electrostatic chuck pins and a device being held by the electrostatic chuck pins. The height adjustment mechanisms can be computer-controlled devices that automatically maintain a flatness of a device being held by the electrostatic chuck pins based on reading from an external measurement tool, such as an interferometer. The height adjustment mechanisms can comprise screw type mechanisms, hydraulic actuators, thermal actuators, hydraulic pistons, magnetic actuators, and/or piezoelectric actuators.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF DRAWINGS

The invention will be better understood from the following detailed description with reference to the drawings, in which.

DETAILED DESCRIPTION

Figure 1:
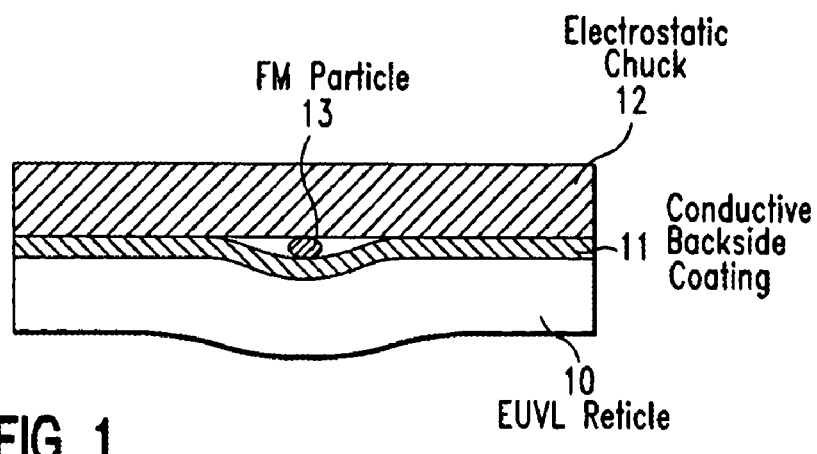
FIG. 1 is a schematic diagram of an electrostatic chuck.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As mentioned above, there are many situations where it is important to hold an item in a completely flat manner using electrostatic chucks. However, one drawback of electrostatic chucks (ESCs) is that, in the event that a foreign matter particle is on the backside surface being held, the frontside surface flatness can be compromised. This is because the particle trapped between the backside of the device prevents the electrostatic chuck from pulling the device to a preset standard defined by the original flatness of the base of the electrostatic chuck. There are also limitations, both physical and economical, that limit how flat the original base plate for the ESC and the substrate in question can actually be polished. The adjustable ESC described below overcomes these limitations.

FIG. 1 illustrates a foreign matter particle 13 trapped between an electrostatic chuck 12 and the conductive backside coating 11 of a device 10 (e.g., EUVL Reticle). As shown in FIG. 1, the foreign matter particle 13 causes the front side of the device 10 to undesirably deform from its completely flat position.

Figure 2:
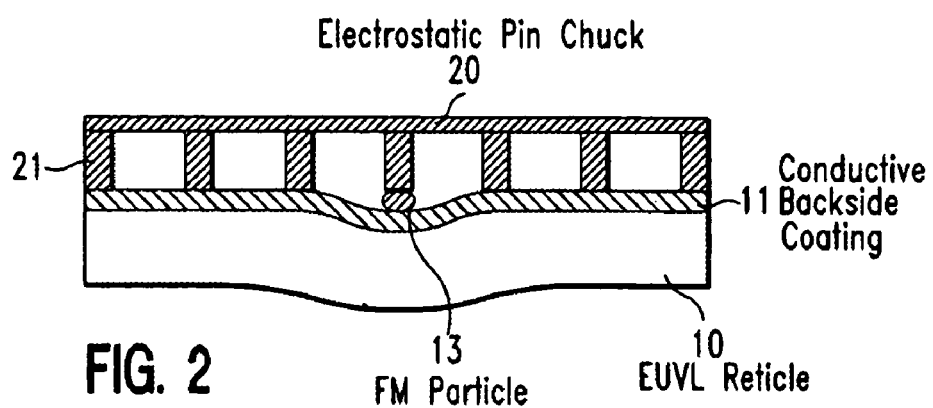
FIG. 2 is a schematic diagram of an electrostatic pin chuck.

Electrostatic pin chucks are an alteration of the above electrostatic chuck 12. The electrostatic pin chuck 20 shown in FIG. 2 includes numerous small electrostatic pins 21 that are in the same plane to hold the device 10. This structure 20 has an advantage over the standard electrostatic chuck 12 in that the surface area of the chuck is decreased, which consequently decreases the probability of a particle being caught between the backside of the device 10 and the electrostatic pin 21 surfaces. However, this format does not eliminate the problem completely and particle 13 still can become stuck between the electrostatic pin chuck 20 and the backside of the device 10, causing deformation of the otherwise flat device 10, as shown in FIG. 2.

Soft conductive backside coatings have been proposed to minimize any device deformation due to a particle being caught between the device 10 and the electrostatic chuck 12, 20. With soft conductive backside coatings, the particle is supposed to become embedded in the soft film enough to not affect the flatness of the clamped mask. However, soft backside coatings present numerous problems, including that the soft backside coating may not be thick enough to completely embed the particle. Further, with the soft conductive backside coatings, mask handling becomes more critical, and other processing problems have arisen including difficulty in cleaning of the mask during mask manufacturing, as no soft backside conductive material has been identified that can clean sufficiently.

Figure 3:
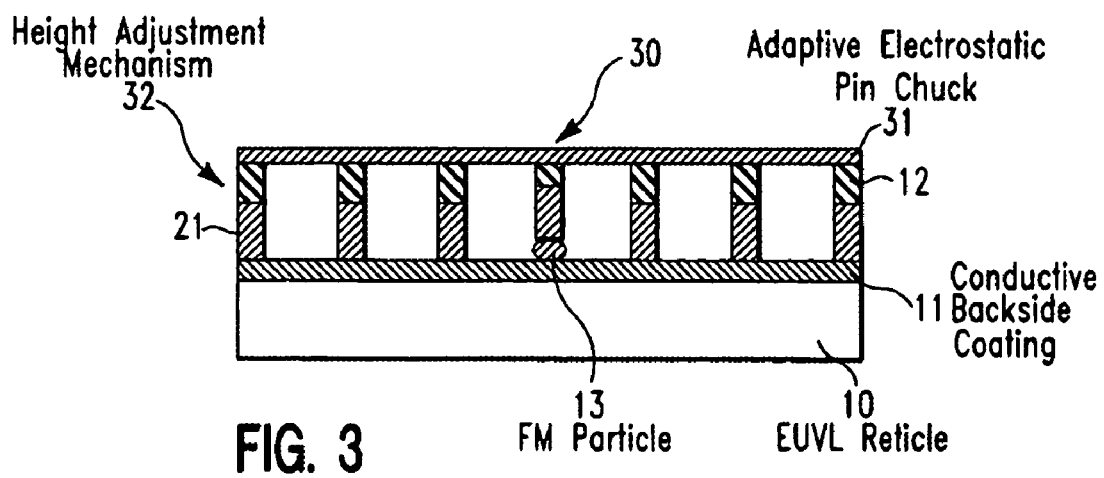
FIG. 3 is a schematic diagram of an adaptive electrostatic pin chuck.

The structure shown in FIG. 3 avoids such problems by making the pin height of the electrostatic pin chuck adjustable. More specifically, the adaptive electrostatic pin chuck 30 shown in FIG. 3 includes height adjustment mechanisms 32 between the base plate 31 of the chuck 30 and the electrostatic pin 21. Hence, if a particle 13 is lodged between the electrostatic pin 21 and the backside of the device 10, the electrostatic pin 21 height is adjusted to compensate for the particle 13 and the flatness of the device 10 is not compromised, as shown in FIG. 3. The base plate 31 should have significant structural integrity such that the shape of device being clamped is changed, not the shape of the base plate.

The structure shown in FIG. 3 provides a significant advantage because the height of the individual electrostatic pins 21 are automatically adjusted. This compensates for any base plate 31 warpage or particle 13 that could interfere with the flatness of the device 10 at processing steps where flatness is crucial, such as write, inspection, exposure, etc.

The height adjustment mechanisms 32 could be computer or manually controlled. The height adjustment mechanisms 32 could comprise screw type mechanisms, piezoelectric actuators, thermal actuators, hydraulic actuators, magnetic actuators, and/or hydraulic pistons. While numerous examples have been listed above, the invention is not limited to these specific height adjustment mechanisms, but instead the invention is applicable to all height adjustment mechanisms, whether now known or unknown, that have enough physical integrity to adjust the shape of the device.

Figure 4:
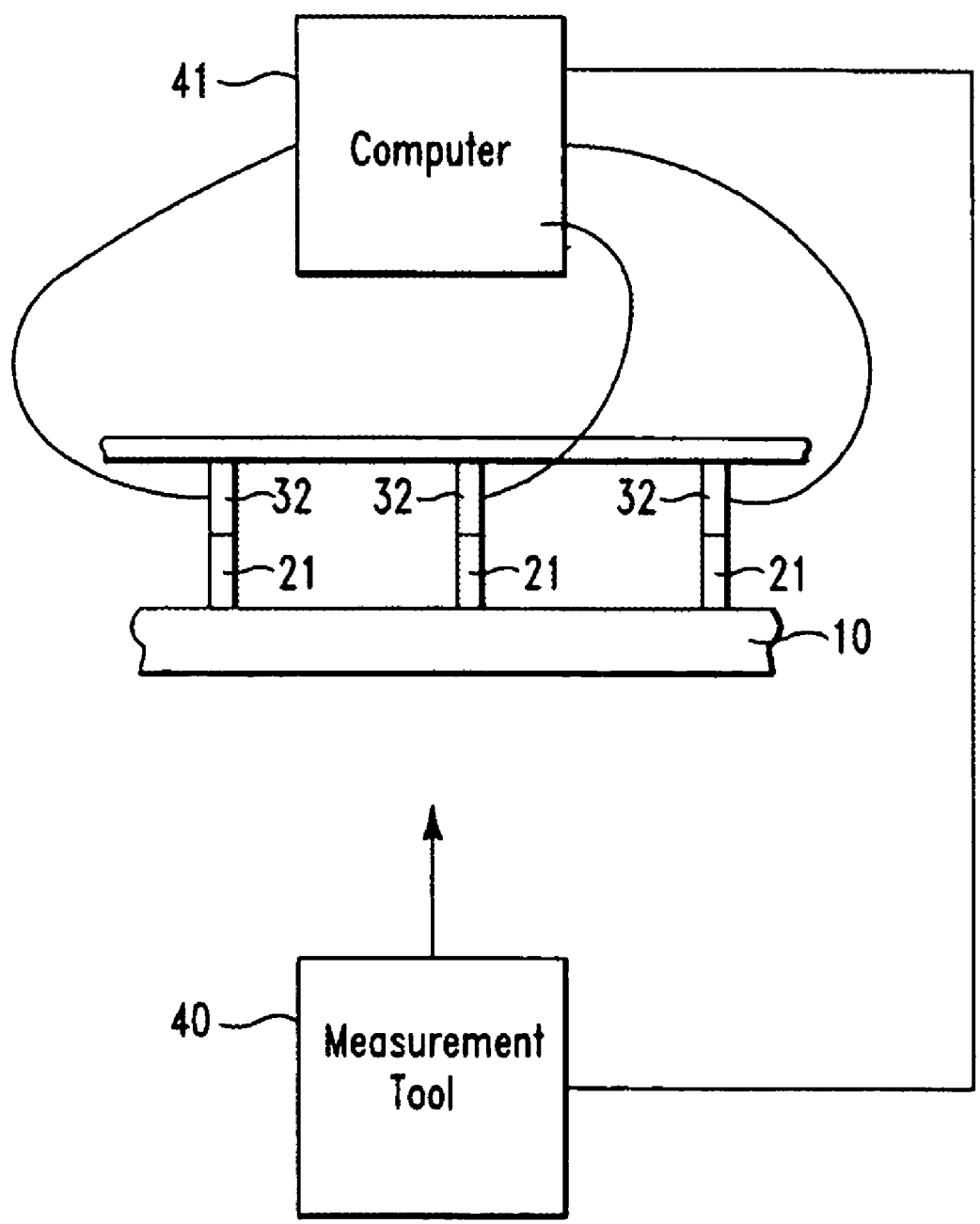
FIG. 4 is a system configuration of the invention.

FIG. 4 illustrates a system embodiment of the invention. This system provides a measurement tool (interferometer) 40 adapted to measure the flatness of the device (e.g., mask) held by the electrostatic chuck pins 21, and a computer 41 connected to the measurement tool and height adjustment mechanisms 32. A computer algorithm takes the measurement tool 40 output and compares it to a preset flatness specification. The computer algorithm then adjusts each individual pin height through the interface between the computer and the individual electrostatic chuck pins 21. This process is repeated until the flatness of the device is within a preset tolerance. Any computer program based on some type of process control would be adequate, although the performance of the individual process control sequence may vary. The computer is adapted to change the shape of the device to conform to a pre-existing standard.

Figure 5:
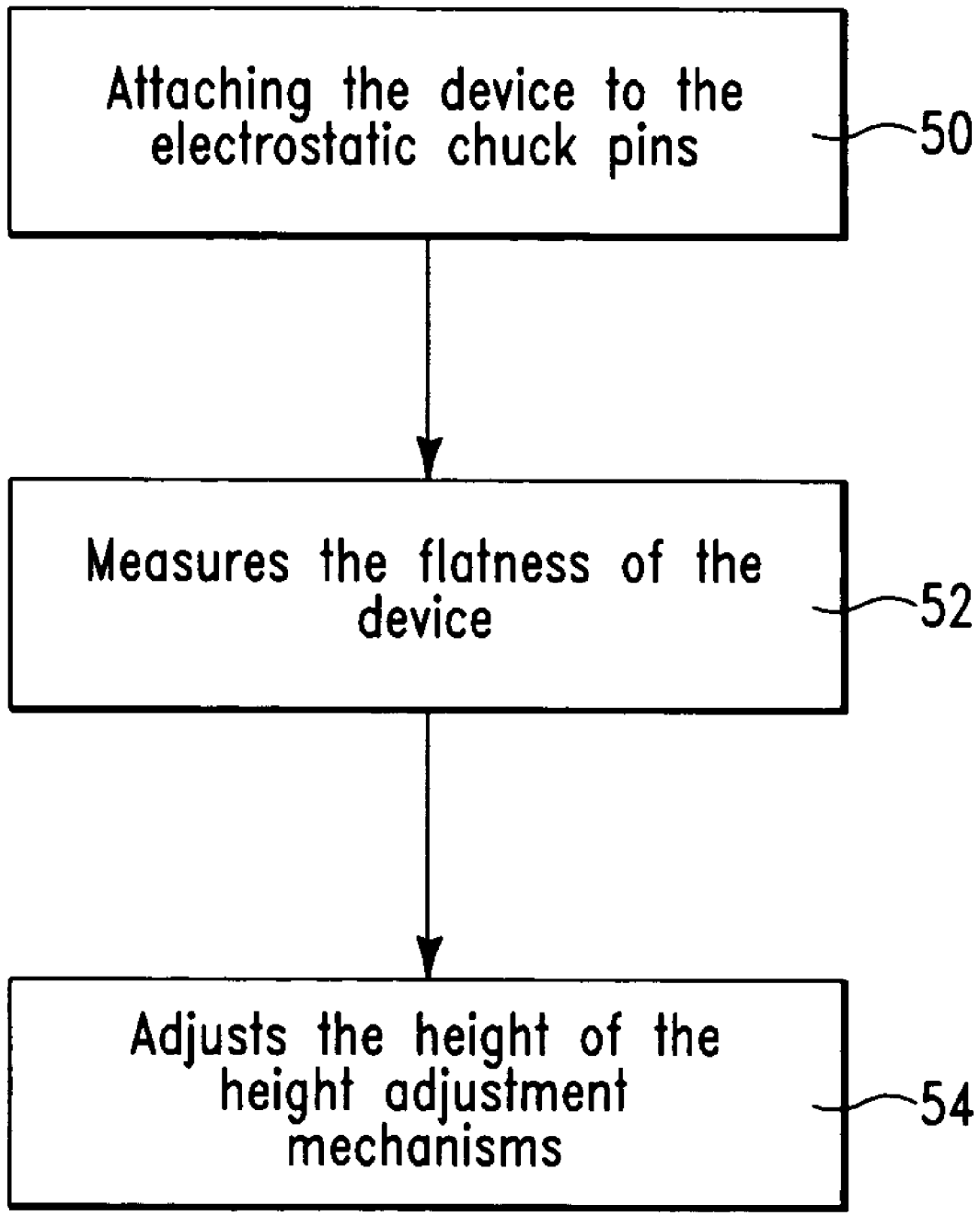
FIG. 5 is a flowchart illustrating one embodiment of the invention.

FIG. 5 shows one embodiment of the invention in flowchart form. More specifically, as shown in item 50, the invention begins by attaching the device to the electrostatic chuck pins. Next, in item 52, the invention measures the flatness of the device. In item 54, the invention adjusts the height of the height adjustment mechanisms that are connected between the electrostatic chuck pins and the plate of the electrostatic chuck, to correct any flatness errors determined in the measuring process. This adjusting process can adjust each height adjustment mechanisms individually and can be performed using the computer connected to the measurement device and to the height adjustment mechanisms. As mentioned above, the adjusting process compensates for foreign matter particles between the electrostatic chuck pins and the device being held by the electrostatic chuck pins, and changes the shape of the device to conform to a pre-existing standard.

The flatness of the device could be measured in-situ on the chuck by an interferometer to ensure that the mask is consistently flat. The flatness data from the interferometer could be fed back to the computer control algorithm which would then adjust the height of each individual pin to achieve the desired flatness. This flatness could either be a preexisting specification with some tolerance or an initial specification for each individual mask. The initial specification for each mask could come from a file of the interferometer output at the initial processing step (e.g., write) where the plate was first electrostatically mounted. This measure of flatness could be assigned to the device and follow the device through subsequent processing and exposure steps to ensure that the mask is the same shape at every critical adaptive pin chucking processing point. The invention can permit the flatness to deviate slightly from the preexisting specification.

Therefore, the invention described above provides the ability to adjust the flatness of a device being held by an electrostatic chuck. More specifically, the invention provides height adjustment mechanisms on the chuck pins. Thus, with the invention, the flatness of the device can be measured and its shape adjusted. The invention compensates for foreign matter particles that may be caught between the chuck and the device or for other flatness irregularities in the device or the chuck itself. By increasing the control over the flatness of the device being held by the electrostatic chuck, the invention allows next generation processing to occur by substantially increasing the exactness with which the chuck holds the device in question.

This invention can be used in many different areas, such as optical lithography, Electron Beam Projection Lithography (EPL), imprint lithography, as well as Extreme Ultra Violet Lithography (EUVL). In all of these technologies, an extremely flat surface is required not only during certain stages of the device manufacturing, such as write and inspection, but also during the expose process where the image on the mask is transferred to a semiconductor surface. In the cases of optical lithography and EPL, the electrostatic clamping will have to be administered at the edges of the mask during the exposure process. Also, the base plate, which provides the rigid surface for the clamping, should have the interior hollow to allow the exposure light/e-beam to pass through to the clamped mask. However, during the manufacturing of the actual mask, it may be possible to clamp across the entire mask.

While the invention has been described in terms of preferred embodiments, those skilled in the art will recognize that the invention can be practiced with modification within the spirit and scope of the appended claims.

The invention claimed is:

1. An electrostatic chuck comprising:
  a base plate;
  individually controlled height adjustment mechanisms connected to said base plate; and
  electrostatic chuck pins connected to said height adjustment mechanisms,
  wherein said height adjustment mechanisms are adapted to individually adjust positions of said electrostatic chuck pins to change a shape of a device being held by said electrostatic chuck pins so as to compensate for flatness deformities in said device.

2. The electrostatic chuck in claim 1, wherein said height adjustment mechanisms comprise computer-controlled devices.

3. The electrostatic chuck in claim 1, wherein said height adjustment mechanisms comprise devices that automatically maintain a flatness of a device being held by said electrostatic chuck pins.

4. The electrostatic chuck in claim 1, wherein said height adjustment mechanisms comprise one of screw type mechanisms, piezoelectric actuators, hydraulic actuators, hydraulic pistons, thermal actuators, and magnetic actuators.

5. A system for maintaining a device flat on an electrostatic chuck, said system comprising:
- an electrostatic chuck comprising individually controlled height adjustment mechanisms and electrostatic pins connected to said height adjustment mechanisms;
- a measurement tool adapted to measure the flatness of a device held by said electrostatic pins; and
- a computer linked to said height adjustment mechanisms and said measurement tool, said computer being adapted to change a shape of said device so as to adjust said flatness of said device by individually adjusting said height adjustment mechanisms based on feedback from said measurement tool.

6. The system in claim 5, wherein said height adjustment mechanisms individually control the height of each electrostatic pin.

7. The system in claim 5, wherein said height adjustment mechanisms control the flatness of said device being held by said electrostatic pins.

8. A system for maintaining a device flat on an electrostatic chuck, said system comprising:
- an electrostatic chuck comprising individually controlled height adjustment mechanisms and pins connected to said height adjustment mechanisms;
- a measurement tool adapted to measure the flatness of a device held by said electrostatic chuck pins; and
- a computer linked to said height adjustment mechanisms and said measurement tool, said computer being adapted to change a shape of said device so as to adjust said flatness of said device by individually adjusting said height adjustment mechanisms based on feedback from said measurement tool,
- wherein said height adjustment mechanisms compensate for foreign matter particles between said electrostatic chuck pins and said device being held by said electrostatic chuck pins.

9. The system in claim 5, wherein said height adjustment mechanisms comprise computer-controlled devices.

10. The system in claim 5, wherein said computer is adapted to change a shape of said device to conform to a pre-existing standard.

11. The system in claim 5, wherein said height adjustment mechanisms comprise one of screw type mechanisms, piezoelectric actuators, hydraulic actuators, hydraulic pistons, thermal actuators, and magnetic actuators.

12. A system for maintaining a device flat on an electrostatic chuck, said system comprising:
- an electrostatic chuck comprising: a base plate; individually controlled height adjustment mechanisms connected to said base plate; and electrostatic chuck pins connected to said height adjustment mechanisms;
- a measurement tool adapted to measure the flatness of a device held by said electrostatic chuck pins; and
- a computer connected to said height adjustment mechanisms and said measurement tool, said computer being adapted to change a shape of said device so as to adjust said flatness of said device by individually adjusting said height adjustment mechanisms based on feedback from said measurement tool.

13. The system in claim 12, wherein said height adjustment mechanisms comprise computer-controlled devices.

14. The system in claim 12, wherein said computer changes the shape of said device to conform to a pre-existing standard by individually adjusting said height adjustment mechanisms.

15. The system in claim 12, wherein said height adjustment mechanisms comprise one of screw type mechanisms, piezoelectric actuators, hydraulic actuators, hydraulic pistons, thermal actuators, and magnetic actuators.

16. A system for maintaining a device flat on an electrostatic chuck, said system comprising:
- an electrostatic chuck comprising: a base plate; individually controlled height adjustment mechanisms connected to said base plate; and electrostatic chuck pins connected to said height adjustment mechanisms;
- a measurement tool adapted to measure the flatness of a device held by said electrostatic chuck pins; and
- a computer connected to said height adjustment mechanisms and said measurement tool, said computer being adapted to change a shape of said device so as to adjust said flatness of said device by individually adjusting said height adjustment mechanisms based on feedback from said measurement tool,
- wherein said height adjustment mechanisms compensate for foreign particles between said electrostatic chuck pins and a device being held by said electrostatic chuck pins.

17. A method of attaching a device to an electrostatic chuck, said method comprising:
- attaching said device to electrostatic pins of said electrostatic chuck;
- measuring a flatness of said device; and
- individually controlling each of said electrostatic pins to individually adjust a height of each of said electrostatic pin to change a shape of said device so as to correct any flatness errors determined in said measuring of said flatness of said device.

18. The method in claim 17, wherein said adjusting of said height of said electrostatic pins comprises adjusting height adjustment mechanisms connected between said electrostatic pins and a plate of said electrostatic chuck.

19. The method in claim 18, wherein said adjusting process adjusts each height adjustment mechanism individually.

20. The method in claim 17, wherein said adjusting process is performed using a computer connected to a measurement device and to height adjustment mechanisms.

21. The method in claim 17, wherein said adjusting process compensates for foreign matter particles between said electrostatic pins and said device being held by said electrostatic pins.

22. The method in claim 17, wherein said adjusting process changes the shape of said device to conform to a pre-existing standard.

23. A method of attaching a device to an electrostatic chuck, said method comprising:
- attaching said device to electrostatic chuck pins of said electrostatic chuck;
- measuring a flatness of said device; and
- individually controlling each of said electrostatic pins to individually adjust a height of each of said electrostatic pin to change a shape of said device so as to correct any flatness errors determined in said measuring process, wherein said measuring process is performed using an interferometer.

24. A method of attaching a device to an electrostatic chuck, said method comprising:

attaching said device to electrostatic chuck pins of said electrostatic chuck;

measuring a flatness of said device; and individually controlling a height of height adjustment mechanisms connected between said electrostatic chuck pins and a plate of said electrostatic chuck to change a shape of said device so as to correct any flatness errors determined in said measuring process.

25. The method in claim 24, wherein said adjusting process is performed using a computer connected to a measurement device and to said height adjustment mechanisms.

26. The method in claim 24, wherein said adjusting process compensates for foreign matter particles between said electrostatic chuck pins and said device being held by said electrostatic chuck pins.

27. The method in claim 24, wherein said adjusting process changes a shape of said device to conform to a pre-existing standard.

28. The method in claim 24, wherein said measuring process is performed using an interferometer.

* * * * *